US008519260B2

(12) United States Patent
Cotte et al.

(10) Patent No.: US 8,519,260 B2
(45) Date of Patent: Aug. 27, 2013

(54) METHOD TO EVALUATE EFFECTIVENESS OF SUBSTRATE CLEANNESS AND QUANTITY OF PIN HOLES IN AN ANTIREFLECTIVE COATING OF A SOLAR CELL

(75) Inventors: John M. Cotte, New Fairfield, CT (US); Laura L. Kosbar, Mohegan Lake, NY (US); Deborah A. Neumayer, Danbury, CT (US); Xiaoyan Shao, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 527 days.

(21) Appl. No.: 12/832,375

(22) Filed: Jul. 8, 2010

(65) Prior Publication Data

US 2012/0006396 A1   Jan. 12, 2012

(51) Int. Cl.
*H01L 31/0236* (2006.01)

(52) U.S. Cl.
USPC ............... 136/256; 257/E21.53; 257/E31.13; 438/16

(58) Field of Classification Search
USPC .................. 257/E27.123–E27.126; 136/251, 136/244, 256
See application file for complete search history.

(56) References Cited

U.S. PATENT DOCUMENTS

2002/0166581 A1* 11/2002 Kondo et al. ................. 136/258
2006/0255420 A1* 11/2006 Bui et al. ...................... 257/448
2008/0128846 A1* 6/2008 Bui et al. ...................... 257/437

OTHER PUBLICATIONS

Oskam, G., et al., "In Situ Measurements of Interface States at Silicon Surfaces in Fluoride Solutions", Physical Review Letters, Feb. 26, 1996, vol. 76, No. 9, pp. 1521-1524.
Oskam, G., et al., "Electrochemical deposition of metals onto silicon", J. Phys. D: Appl. Phys. 31, 1998, pp. 1927-1949.
U.S. Appl. No. 12/762,665 entitled, "Method of Direct Electrodeposition on Semiconductors" filed on Apr. 19, 2010, First Named Inventor: Laura L. Kosbar.

* cited by examiner

*Primary Examiner* — David Vu
*Assistant Examiner* — Jonathan Han
(74) *Attorney, Agent, or Firm* — Scully, Scott, Murphy & Presser, P.C.; Louis J. Percello, Esq.

(57) ABSTRACT

A method to determine the cleanness of a semiconductor substrate and the quantity/density of pin holes that may exist within a patterned antireflective coating (ARC) is provided. Electroplating is employed to monitor the changes in the porosity of the ARC caused by the pin holes during solar cell manufacturing. In particular, electroplating a metal or metal alloy to form a metallic grid on an exposed front side surface of a substrate also fills the pin holes. The quantity/density of metallic filled pin holes (and hence the number of pin holes) in the patterned ARC can then be determined.

20 Claims, 4 Drawing Sheets

METHOD TO EVALUATE EFFECTIVENESS OF SUBSTRATE CLEANNESS AND QUANTITY OF PIN HOLES IN AN ANTIREFLECTIVE COATING OF A SOLAR CELL

BACKGROUND

The present disclosure relates to the manufacturing of solar cells, and in particular to a method that can be used to determine the cleanness of a semiconductor substrate as well as the number of pin holes that may exist within a patterned antireflective coating (ARC) that is present on a front side surface of the substrate. The present invention also provides a solar cell including a patterned antireflective coating located on a front side surface of a semiconductor substrate in which the patterned antireflective coating includes metallic filled pin holes therein.

Photovoltaic solar cells, i.e., devices which convert photons from sunlight into electricity, are regarded as one of the key technologies which will lead to a sustainable energy future. In order for solar energy to be cost competitive and comparable with non-renewable sources of energy (such as, for example, oil, coal and natural gas), low cost processing and high efficiency solar cells are essential.

The majority (over 90%) of solar cells currently in production are based on silicon wafers with screen printed metal pastes as electrical contacts. Screen printing is attractive due to its simplicity in processing and high throughput capability; however, the high contact resistance, high paste cost, shadowing from wide conductive lines, high temperature processing, and mechanical yield loss are disadvantages that have not been overcome even after thirty plus years of research and development.

In a typical screen printing process used in forming a metallic grid on a front side surface of a semiconductor substrate, a thin layer of silicon nitride is used as an antireflective coating (ARC) prior to screen printing the metallic grid. The silicon nitride layer improves the adsorption of sunlight into the semiconductor substrate through the front side surface which will be converted to electricity. The silicon nitride layer is usually deposited on a textured surface, which is very rough with surface topography of micron size tall features. During the formation of the silicon nitride layer, pin holes are introduced into the silicon nitride film. The presence of pin holes provides the silicon nitride layer with a porosity. It has been impossible to characterize the porosity of such silicon nitride films. The porosity of the silicon nitride film caused by these pin holes tends to adversely impact the film's optical properties and silicon surface passivation properties, which adversely impact the final solar cell performance.

SUMMARY

The present disclosure provides a method to determine the cleanness of a semiconductor substrate as well as the quantity/density of pin holes that may exist within a patterned antireflective coating (ARC) that is present on a front side surface of the substrate. In particular, the applicants of this disclosure have determined that the porosity of the patterned ARC caused by the pin holes is closely related to the process that is used to clean the front side surface of a semiconductor substrate prior to forming an ARC thereon.

In this disclosure, electroplating is employed to monitor the changes in the porosity of the ARC caused by the pin holes during solar cell manufacturing. In particular, electroplating a metal or metal alloy to form a metallic grid on an exposed front side surface of the semiconductor substrate also fills in the pin holes within the patterned ARC. The quantity/density of the metallic filled pin holes in the patterned ARC can then be determined by visual or optical means. If the number of metallic pin holes is determined to be too high for a given ARC, the surface of the semiconductor substrate used in forming the next solar cell or batch of solar cells can be subjected to a different cleaning process. After using the different cleaning process, a patterned ARC can be formed on a front side surface of another semiconductor substrate and thereafter a metallic grid can be formed on the exposed surface of the front side surface of the semiconductor substrate. Pin holes present in the patterned ARC can be determined as described above and if the number of metallic filled pin holes is determined to be satisfactory for a given ARC the process has been optimized. If not, the above is repeated until a satisfactory number of metallic filled pin holes is determined.

One aspect of the present invention relates to a method of determining the cleanness of the semiconductor substrate and the quantity/density of pin holes within a patterned ARC that is present on the front side surface of a semiconductor substrate.

In one embodiment, the method includes providing a semiconductor substrate including a p-type semiconductor portion and an overlying n-type semiconductor portion. An exposed surface of the p-type semiconductor portion defines a back side surface of the semiconductor substrate and an exposed surface of the n-type semiconductor portion defines a front side surface. Either prior to or after processing the back side surface of the semiconductor substrate, a patterned antireflective coating including a grid pattern therein is formed on the front side surface of the semiconductor substrate. Because of the nature of the front side surface of the semiconductor substrate, the patterned antireflective coating typically includes pin holes therein. A front side surface metallic film is formed within the grid pattern by electrodeposition, wherein during the electrodeposition the pin holes in the patterned antireflective coating are filled with a metallic material. The quantity/density of the metallic filled pin holes in the patterned antireflective coating is then determined by visual and/or optical means.

In another embodiment, the method includes providing a semiconductor substrate including a p-type semiconductor portion and an overlying n-type semiconductor portion. An exposed surface of the p-type semiconductor portion defines a back side surface of the semiconductor substrate and an exposed surface of the n-type semiconductor portion defines a front side surface. The front side surface of the semiconductor substrate is roughened and thereafter the back side surface of the semiconductor substrate is processed to include at least a back side surface metallic film. After processing the back side surface of the semiconductor structure, the front side surface of the semiconductor substrate is cleaned to eliminate native oxide formation. A patterned antireflective coating including a grid pattern therein is then formed on the cleaned front side surface of the semiconductor substrate. Due to the nature of the front side surface, the patterned antireflective coating includes pin holes therein. A front side surface metallic film is formed within the grid pattern by electrodeposition, wherein during the electrodeposition the pin holes in the patterned antireflective coating are filled with a metallic material. After electrodeposition, the quantity/density of the metallic filled pin holes in the patterned antireflective coating is determined by visual and/or optical means.

In another embodiment, the method includes providing a semiconductor substrate including a p-type semiconductor portion and an overlying n-type semiconductor portion. An exposed surface of the p-type semiconductor portion defines a back side surface of the semiconductor substrate and an exposed surface of the n-type semiconductor portion defines a front side surface. The front side surface of the semiconductor substrate is then roughened and thereafter a patterned antireflective coating including a grid pattern therein is formed on the cleaned front side surface of the semiconductor substrate. Due to the nature of the front side surface, the patterned antireflective coating includes pin holes therein. The back side surface of the semiconductor substrate is then processed to include at least a back side surface metallic film. Next, a front side surface metallic film is formed within the grid pattern by electrodeposition, wherein during the electrodeposition the pin holes in the patterned antireflective coating are filled with a metallic material. After electrodeposition, the quantity/density of the metallic filled pin holes in the patterned antireflective coating is determined by visual and/or optical means.

The present invention also provides a solar cell including a patterned antireflective coating located on a front side surface of a semiconductor substrate in which the patterned antireflective coating includes metallic filled pin holes therein. In particular, the solar cell of this disclosure include a semiconductor substrate including a p-type semiconductor portion and an overlying n-type semiconductor portion. An exposed surface of the p-type semiconductor portion defines a back side surface of the semiconductor substrate and an exposed surface of the n-type semiconductor portion defines a front side surface. The structure further includes at least a back side surface metallic film located on the back side surface of the semiconductor substrate and a patterned antireflective coating having a grid pattern therein located on the front side surface of the semiconductor substrate. The patterned antireflective coating includes metallic filled pin holes located therein. The structure further includes a front side surface metallic film located within the grid pattern.

DETAILED DESCRIPTION

The present invention, which provides a method that can be used to determine the cleanness of a semiconductor substrate as well as the quantity/density of pin holes that may exist in a patterned antireflective coating (ARC) that is present on the front side surface of the substrate, as well as a solar cell, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
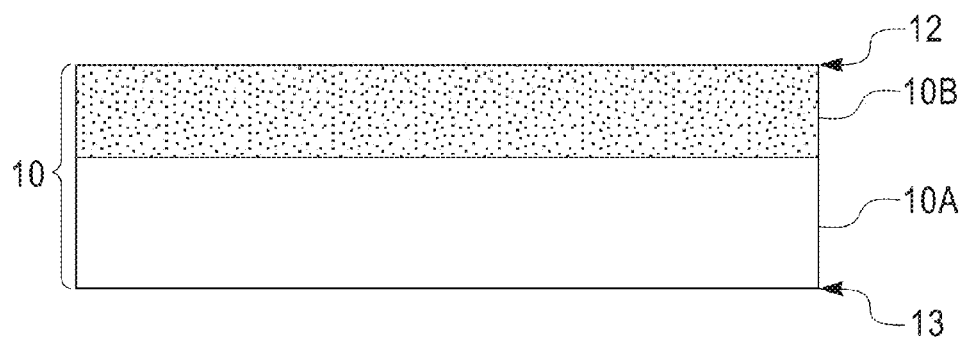
FIG. 1 is a pictorial representation (through a cross sectional view) illustrating an initial structure including a semiconductor substrate having an n-type semiconductor portion and an underlying p-type semiconductor portion that can be employed in one embodiment of the present invention.

Referring now to FIG. 1, there is illustrated an initial structure 8 that can be employed in one embodiment of the invention. The initial structure 8 includes a semiconductor substrate 10 having a front side surface 12 and a back side surface 13 that is opposite the front side surface 12.

The semiconductor substrate 10 can comprise any semiconductor material including, but not limited to, Si, Ge, SiGe, SiC, SiGeC, GaAs, GaN, InAs, InP, CdTe, CuIn(Ga)Se(S), a-Si, and all other III/V or II/VI compound semiconductors. In one embodiment of the present invention, the semiconductor substrate 10 is comprised of Si. In another embodiment, the semiconductor substrate 10 is comprised of a single crystalline semiconductor material. In yet another embodiment, the semiconductor substrate 10 is comprised of a multicrystalline semiconductor material.

The semiconductor substrate 10 illustrated in FIG. 1 includes a p-type semiconductor portion 10A that includes a p-type dopant, and an overlying n-type semiconductor portion 10B that includes an n-type dopant. The term "n-type dopant" is used throughout the present disclosure to denote an atom from Group VA of the Periodic Table of Elements including, for example, P, As and/or Sb. The term "p-type dopant" is used throughout the present disclosure to denote an atom from Group IIIA of the Periodic Table of Elements including, for example, B, Al, Ga and/or In.

The concentration of dopant within the semiconductor material may vary depending on the ultimate end use of the semiconductor material and the type of dopant atom being employed. In the particular embodiment shown in FIG. 1, the p-type semiconductor portion 10A of the semiconductor substrate 10 typically has a p-type dopant concentration from 1e15 atoms/cm$^3$ to 1e17 atoms/cm$^3$, with a p-type dopant concentration from 5e15 atoms/cm$^3$ to 5e16 atoms/cm$^3$ being more typical. The n-type semiconductor portion 10B of the semiconductor substrate 10 typically has an n-type dopant concentration from 1e16 atoms/cm$^3$ to 1e22 atoms/cm$^3$, with an n-type dopant concentration from 1e19 atoms/cm$^3$ to 1e21 atoms/cm$^3$ being more typical. The sheet resistance of the n-type semiconductor portion 10B is typically greater than 50 ohm/sq, with a sheet resistance range of the n-type semiconductor portion 10B from 60 ohm/sq to 200 ohm/sq being more typical.

The dopant (n-type and/or p-type) can be introduced into an initial doped or undoped semiconductor material using techniques well known to those skilled. For example, the n-type and/or p-type dopant can be introduced into the semiconductor material by ion implantation, gas phase doping, liquid solution spray/mist doping, and/or out-diffusion of a dopant atom from an overlying sacrificial dopant material layer that can be formed on the substrate, and removed after the out-diffusion process. In some embodiments, the dopant (s) can be introduced into the semiconductor substrate 10 during the formation thereof. For example, an in-situ epitaxial growth process can be used to form a doped semiconductor substrate 10.

The front side surface 12 of the semiconductor substrate 10 may be non-textured or textured. In one embodiment, the front side surface 12 of the semiconductor substrate 10 is textured. A textured (i.e., specially roughened) surface is used in solar cell applications to increase the efficiency of light absorption. The textured surface decreases the fraction of incident light lost to reflection relative to the fraction of incident light transmitted into the cell since photons incident on the side of an angled feature will be reflected onto the sides of adjacent angled features and thus have another chance to be absorbed. Moreover, the textured surface increases internal absorption, since light incident on an angled silicon surface will typically be deflected to propagate through the substrate at an oblique angle, thereby increasing the length of the path taken to reach the substrate's back surface, as well as making it more likely that photons reflected from the substrate back surface will impinge on the front surface at angles compatible with total internal reflection and light trapping. The texturing of the front side surface 12 of the semiconductor substrate 10 can be performed utilizing conventional techniques well known in the art. In one embodiment, a KOH based solution can be used to texture the front side surface 12 of the single crystalline silicon semiconductor substrate 10. In another embodiment, a $HNO_3$/HF solution can be used to texture a multicrystalline silicon wafer surface. In yet another embodiment, texturing can be achieved by utilizing a combination of reactive ion etching (RIE) and a mask comprising closely packed self-assembled polymer spheres.

In some embodiments of the present application, the front side surface 12 and/or the back side surface 13 of the semiconductor substrate 10 can be cleaned prior to processing these surfaces. When a cleaning step is employed, any conventional cleaning process that is well known to those skilled in the art can be employed which is capable of removing native oxides and other contaminants from the exposed surface(s) of the semiconductor substrate 10. In one embodiment, a dilute HF solution having a concentration between 0.5% to 15% can be used to clean the exposed surface(s) of the semiconductor substrate 10.

It is observed that the effectiveness of cleaning the front side surface 12 is essential in limiting the number of pin holes that are formed within an overlying antireflective coating (ARC). If too large a number of pin holes is present in the ARC, the efficiency of the solar cell fabricated may be adversely affected since the quantity/density of pin holes and the quality of silicon surface passivation influences the amount of light that can be converted into electricity.

After providing the initial structure 8 shown in FIG. 1, the back side surface 13 is typically processed to include at least a back side surface metallic film 16 on the back side surface 13 of the semiconductor substrate 10.

Figure 2:
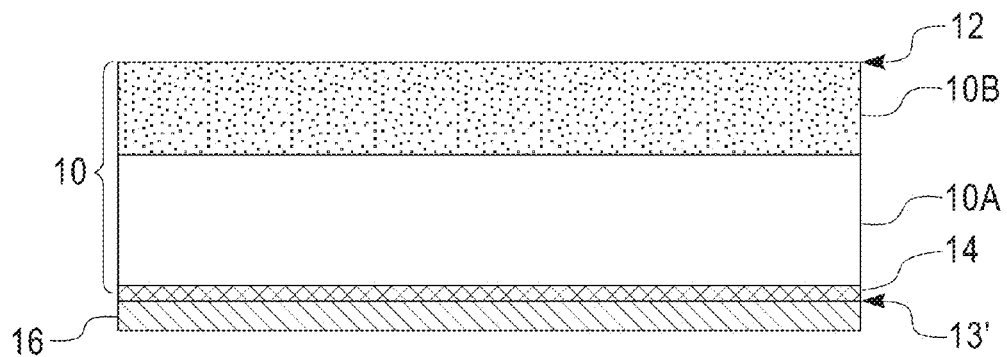
FIG. 2 is a pictorial representation (through a cross sectional view) illustrating the structure of FIG. 1 after processing a back side surface of the semiconductor substrate.

In some embodiments, and as shown in FIG. 2, a P++ back side surface field layer 14 can be formed at the back side surface 13 of semiconductor substrate 10 prior to forming the back side surface metallic film 16. The term "P++ back side surface field layer" is used throughout this disclosure to denote a layer located at the back side surface of a semiconductor substrate having a concentration of p-type dopants which is much higher (typically on the order of 1e4 to 1e6 times) as compared to the p-type dopant concentration that is located within the p-type semiconductor portion 10A of the semiconductor substrate 10.

When present, the P++ back side surface field layer 14 is formed by first forming an electrodeposited p-type dopant layer (not shown) on the back side surface 13 of the semiconductor substrate 10 and thereafter an annealing step is employed to convert a portion of the p-type semiconductor portion 10A (which is located at the interface with the p-type dopant layer) and the electrodeposited p-type dopant layer into the P++ back side surface field layer 14. During the anneal, the p-type dopant layer can be completely incorporated/consumed into the p-type semiconductor portion of the semiconductor substrate. In some embodiments, the thickness of the semiconductor substrate can increase due to the incorporation of the p-type dopant layer. In other embodiments, the change in semiconductor substrate thickness is negligible.

The electrodeposited p-type dopant layer that can be formed on the back side surface 13 of semiconductor substrate 10 includes at least one an atom from Group IIIA of the Periodic Table of Elements including, for example, B, Al, Ga and/or In.

As mentioned above, the electrodeposited p-type dopant layer is formed by an electrodeposition method. The electrodeposition method used in forming the electrodeposited p-type dopant layer includes the use of any conventional electrodeposition or electroplating apparatus that is well known to those skilled in the art. A soluble or insoluble anode may be used with the plating bath. Typically, the anode is placed parallel to the back side surface 13 of the semiconductor substrate 10, and a cathode is in contact with the front side surface 12 of the semiconductor substrate 10; the cathode is not however in contact with the plating solution.

The electrodeposition method employed in forming the electrodeposited p-type dopant layer also includes the use of any conventional electroplating bath (or composition). The electroplating bath includes one or more sources of p-type dopant ions to plate the electrodeposited p-type dopant layer. The one or more sources of p-type dopant ions provide p-type dopant ions which include, but are not limited to, B, Al, Ga and In. Alloys that can be electrodeposited (or plated) include, but are not limited to, binary and ternary alloys of the foregoing p-type dopants.

When boron (B) is to be electroplated, the electroplating of boron can be achieved utilizing solutions containing B-containing alloys including, but not limited to, $B_2O_3$, $B(OH)_3$, MoB, PdB, NiB, CoB, CuB, ZnB, PtB, AgB, PdB, SnB, and FeB. Typical boron-containing compounds used in electroplating of boron alloys include, but are not limited to, dimethylamine-borane (DMAH), and boron hydride.

When aluminum (Al) is to be electroplated, the electroplating of aluminum can be achieved using commercial aluminum baths. Currently most suitable Al plating solutions are non-aqueous ionic liquids, such as $AlCl_3$ in 1-ethyl-3-methylimidazoline chloride (EMImCl).

When gallium (Ga) is to be electrodeposited, the electroplating of gallium can be achieved using Ga-containing salts, acids, organic solvents, and other additives. Ga-containing salts include, but are not limited to, Ga chloride, Ga sulfate, Ga sulfamate, Ga acetate, Ga carbonate, Ga nitrate, Ga perchlorate, Ga phosphate, Ga oxide, and Ga hydroxide.

When indium (In) is to be electrodeposited, the electroplating of In can be achieved using, for example, indium sulfamate, indium sulfate, indium cyanide and indium fluoborate baths.

In general, the p-dopant ions are included in the electroplating bath such that p-type dopant ions range in concentrations from 0.01 g/L to 200 g/L, or such as from 0.5 g/L to 150 g/L, or such as from 1 g/L to 100 g/L, or such as from 5 g/L to 50 g/L. Typically, p-type dopant ions are included in amounts such that p-type dopant ion concentrations range from 0.01 to 100 g/L, more typically from 0.1 g/L to 60 g/L.

The electroplating bath that can be used may include one or more conventional diluents. Typically, the electroplating bath is aqueous; however, conventional organic diluents may be used if desired. Non-aqueous ionic liquids are commonly used to plate Al. Optional conventional electroplating bath additives also may be included. Such additives include, but are not limited to, one or more of brighteners, suppressors, surfactants, inorganic acids, organic acids, brightener breakdown inhibition compounds, alkali metal salts, and pH adjusting compounds. Additional additives may be included in the plating baths to tailor the performance of the plating for a particular substrate. Such additional additives may include, but are not limited to, levelers and compounds which affect throwing power.

In addition to the above, the electroplating bath may also include hardeners, malleability, ductility and deposition modifiers, suppressants and the like.

The electroplating baths are typically maintained in a temperature range of from 20° C. to 110° C., with a temperature from 20° C. to 50° C. being more typical. Plating temperatures may vary depending on the material to be plated. Typically, electroplating is performed at a temperature from 10° C. to 50° C., with a plating temperature from 20° C. to 40° C. being more typical.

In one embodiment of the present application, the electrodeposition process employed in forming the electrodeposited p-type dopant layer uses current waveforms that apply a low current density initially, and after a predetermined period of time, the current density is increased to a high current density. The specific waveforms that are employed can be continuously applied or pulsed waveforms can be employed in the present invention. It has been determined that the use of the aforementioned current waveform (e.g., low current density to high current density) overcomes the non-uniformity problem that exists during prior art electrodeposition processes.

The low current density that is initially used to plate the p-type dopants from the plating bath is typically within a range from 1 mAmps/cm$^2$ to 40 mAmps/cm$^2$, with a current density from 5 mAmps/cm$^2$ to 20 mAmps/cm$^2$ being more typical. Plating within the low current density regime is typically performed for a time period from 5 seconds to 120 seconds, with a time period from 10 seconds to 60 seconds being more typical. After this initial period of time in which plating occurs using the low current density mentioned above, the current density is increased to a high current density regime. The high current density regime typically employs a current density of greater than 40 mAmps/cm$^2$, with a current density from greater than 40 mAmps/cm$^2$ to 200 mAmps/cm$^2$ being more typical. Plating within the high current density regime is typically performed for a time period from 1 second to 1 hour, with a time period from 5 seconds to 300 seconds being more typical.

The increase from the low current density regime to the high current density regime may include a continuous ramp or it may include various ramp and soak cycles including a sequence of constant current plateaus. When a continuous ramp is employed, the rate of increase can be from 1 mAmp/cm$^2$/sec to 100 mAmp/cm$^2$/sec. The same ramp rate can be used in the various ramp and soak cycles and the soak at a desired current density may vary and is not critical to the practice of the present invention.

Although the electrodeposition of the electrodeposited p-type dopant layer is described using the aforementioned current waveform (i.e., from a low current density to a high current density), the electrodeposition of the electrodeposited p-type dopant layer can also be performed utilizing other current waveforms, i.e., from high to low, or a single waveform.

The thickness of the electrodeposited p-type dopant layer may vary depending on the conditions of the electrodeposition process that is employed to plate the p-type dopant onto the back side surface 13. Typically, the electrodeposited p-type dopant layer has a thickness from 100 Å to 10000 Å, with a thickness from 500 Å to 5000 Å being more typical. Moreover, the electrodeposition method that includes current waveforms from low to high provides complete coverage of the electrodeposited p-type dopant layer on the back side surface 13 of the semiconductor substrate 10. By "complete coverage", it is meant that the electrodeposited p-type dopant layer is continuously present on the entire back side surface 13 of the semiconductor substrate 10.

The concentration of p-type dopant present in the electrodeposited p-type dopant layer may vary depending on the conditions of the electrodeposition process including the content of p-type dopants within the electroplating bath. Typically, the concentration of p-type dopant present in the electrodeposited p-type dopant layer is from 1e21 atoms/cm$^3$ to 6e23 atoms/cm$^3$, with a p-type dopant concentration from 1e22 atoms/cm$^3$ to 6e23 atoms/cm$^3$ being more typical.

After forming the p-type dopant layer on the back side surface 13 of the substrate 10, the structure is subjected to a thermal anneal which drives the electrodeposited p-type dopant atoms from the p-type dopant layer into a portion of the p-type semiconductor portion 10A of the semiconductor substrate forming a P++ doped back side surface field layer 14. As shown in FIG. 2, the anneal can completely incorporate/consume the p-type dopant layer into the p-type semiconductor portion 10A of the semiconductor substrate 10. In some embodiments (as shown in FIG. 2), the thickness of the semiconductor substrate can increase due to the incorporation of the p-type dopant layer. To show the increase in thickness that can be obtained, the size of the original brackets denoting substrate 10 have been maintained. In other embodiments, the change in semiconductor substrate thickness is negligible. It is observed that in FIG. 2, reference numeral 13' denotes the new back side surface of the structure that is formed.

The concentration of p-type dopant within the P++ doped back side surface field layer 14 is greater than the concentration of p-type dopant within the original electrodeposited p-type dopant layer which is now incorporated/consumed into the p-type semiconductor portion 10A of the semiconductor substrate 10. Typically, the concentration of p-type dopant present in the P++ doped back side surface field layer 14 is from 1e19 atoms/cm$^3$ to 1e23 atoms/cm$^3$, with a p-type dopant concentration from 1e20 atoms/cm$^3$ to 1e22 atoms/cm$^3$ being more typical.

The thermal anneal may be performed in a single step or a two-step anneal process can be used. The temperature of the thermal anneal may vary. Typically, the thermal anneal is performed at a temperature from 250° C. or greater, with a temperature from 400° C. to 900° C. being more typical. Thermal annealing can be performed in a forming gas, air, $O_2$, He, Ar, or $N_2$. The thermal anneal includes a furnace anneal, a rapid thermal anneal, a belt furnace anneal, a spike anneal, a microwave anneal or a laser anneal. Typically, the thermal anneal is a rapid thermal anneal in which the anneal time is about typically less than 10 minutes.

The thickness of the resultant P++ doped back side surface field layer 14 is in the range of 1 micrometer to 50 micrometer, with 5 micrometer to 25 micrometer being more typical.

After forming the P++ doped back side surface field layer 14, a back side surface metallic film 16 is formed atop the P++ doped back side surface field layer 14 utilizing an electrodeposition process. The electroplating process used in forming the back side surface metallic film 16 includes electroplating a metal or metal alloy including, for example, Ni, Co, Cu, Al, Ag, Au, Zn, Pt, Fe or alloys thereof. In one embodiment, the back side surface metallic film 16 is comprised of Ni, Co or Cu. In another embodiment, the back side surface metallic film 16 is comprised of Ni or a Ni alloy with thick Cu layer as the final electrode surface.

The electrodeposition method employed in forming back side surface metallic film 16 also includes the use of any conventional electroplating bath (or composition). The electroplating bath includes one or more sources of metal ions to plate metals. The one or more sources of metal ions provide metal ions which include, but are not limited to, Ni, Co, Cu, Zn, Pt, Ag, Au, Al, Pd, Sn, Fe and In. Alloys that can be electrodeposited (or plated) include, but are not limited to, binary and ternary alloys of the foregoing metals. Typically, metals chosen from Ni, Co, Pd, Ag, Au, Al, and Pt are plated from the electroplating bath. More typically, Ni or a Ni alloy is plated from the electroplating bath.

The one or more sources of ions that can be present in the electroplating bath include metal salts or ammonium salts. The salts that can be used include, but are not limited to, halides, nitrates, sulfates, alkane sulfonates, alkanol sulfonate, cyanides, acetates or citrates.

Some of the various types of metal salts that can be employed in the present invention are now described in greater detail. Nickel (Ni) salts which may be used in the electroplating bath include, but are not limited to, one or more of nickel chloride, nickel sulfamate, nickel acetate, nickel ammonium sulfate, and nickel sulfate.

Sources of cobalt (Co) ions include, but are not limited to, one or more of cobalt ammonium sulfate, cobalt acetate, cobalt sulfate and cobalt chloride. Sources of zinc (Zn) ions include, but are not limited to, one or more of zinc bromate, zinc chloride, zinc nitrate and zinc sulfate. Source of iron (Fe) include, but are not limited to, one or more of ferric or ferrous chloride, iron nitrate, iron sulfate, iron acetate, and iron sulfate.

Palladium (Pd) salts which may be used in the electroplating bath include, but are not limited to, one or more of palladium chloride, palladium nitrate, palladium potassium chloride and palladium potassium chloride.

Silver (Ag) salts which may be used in the electroplating bath include, but are not limited to, one or more of silver nitrate, silver sulfate, and silver cyanide.

Gold (Au) salts which may be used in the electroplating bath include, but are not limited to, one or more of gold cyanide, gold sulfate, gold nitrate and gold chloride.

Aluminum (Al) salts which may be used in the electroplating bath include, but are not limited to, one or more of $AlCl_3$-EMImCl (1-Ethyl-3-Methylimidazoline chloride), and $AlCl_3$-$EMImPF_6$.

Platinum (Pt) salts which may be used include, but are not limited to, one or more of platinum tetrachloride, platinum sulfate and sodium chloroplatinate.

In one embodiment of the present disclosure, the plating bath used in forming the back side surface metallic film 16 is composed of nickel sulfamate and boric acid without any organic additives.

The measured pH of the electroplating bath used in forming the back side surface metallic film 16 may be buffered using conventional buffering compounds.

The electroplating baths used in forming the back side surface metallic film 16 are typically maintained in a temperature range of from 20° C. to 110° C., with a temperature from 20° C. to 50° C. being more typical. Plating temperatures used in forming the back side surface metallic film 16 may vary depending on the metal to be plated. Typically, electroplating used in forming the back side surface metallic film 16 is performed at a temperature from 10° C. to 50° C., with a plating temperature from 20° C. to 40° C. being more typical.

In one embodiment of the present application, the electrodeposition process employed in forming the back side surface metallic film 16 uses current waveforms that apply a low current density initially, and after a predetermined period of time, the current density is increased to a high current density. The specific waveforms that are employed can be continuously applied or pulsed waveforms can be employed in the present invention. It has been determined that the use of the aforementioned current waveform (e.g., low current density to high current density) overcomes the non-uniformity problem that exists during prior art electrodeposition processes.

The low current density that is initially used to plate the metal or metal alloy from the plating bath is typically within a range from 1 $mAmps/cm^2$ to 40 $mAmps/cm^2$, with a current density from 5 $mAmps/cm^2$ to 20 $mAmps/cm^2$ being more typical. Plating within the low current density regime is typically performed for a time period from 5 seconds to 120 seconds, with a time period from 10 seconds to 60 seconds being more typical. After this initial period of time in which plating occurs using the low current density mentioned above, the current density is increased to a high current density regime. The high current density regime typically employs a current density of greater than 40 $mAmps/cm^2$, with a current density from greater than 40 $mAmps/cm^2$ to 200 $mAmps/cm^2$ being more typical. Plating within the high current density regime is typically performed for a time period from 1 second to 1 hour, with a time period from 5 seconds to 300 seconds being more typical.

The increase from the low current density regime to the high current density regime may include a continuous ramp or it may include various ramp and soak cycles including a sequence of constant current plateaus. When a continuous ramp is employed, the rate of increase can be from 1 $mAmp/cm^2/sec$ to 100 $mAmp/cm^2/sec$. The same ramp rate can be used in the various ramp and soak cycles and the soak at a desired current density may vary and is not critical to the practice of the present invention.

Although the electrodeposition of back side surface metallic film 16 is described using the aforementioned current waveform (i.e., from a low current density to a high current density), the electrodeposition of the back side surface metallic film 16 can also be performed utilizing other current waveforms, i.e., from high to low, or a single waveform.

The thickness of the back side surface metallic film 16 may vary depending on the type of metal or metal alloy employed as well as the conditions and waveforms used during the electrodeposition process. Typically, the back side surface metallic film 16 has a thickness from 50 Å to 50000 Å, with a thickness from 500 Å to 20000 Å being more typical.

In some embodiments, and prior to electrodepositing the back side surface metallic film 16 onto the P++ back side surface field layer 14, the exposed surface of the P++ doped back side surface field layer 14 is cleaned utilizing any conventional cleaning process including, for example, a dilute HF clean.

In some embodiments (not shown), the back side surface metallic film 16 can be formed directly on the back side surface 13 of the semiconductor substrate 10. In such embodiments, the back side surface metallic film 16 is formed directly on the back side surface 13 of the semiconductor substrate 10 by applying a metallic paste to the back side surface 13 of the semiconductor substrate 10. The metallic paste, which includes any conductive paste such as Al paste, Ag paste or AlAg paste, is formed utilizing conventional techniques that are well known to those skilled in the art of solar cell fabrication. After applying the metallic paste, the metallic paste is heated to a sufficiently high temperature which causes the metallic paste to flow and form a metallic layer on the applied surface of the semiconductor material. In one embodiment, and when an Al or Ag paste is employed, the Al or Ag paste is heated to a temperature from 700° C. to 900° C. which causes the Al or Ag paste to flow and form an Al or Ag layer. The back side surface metallic film 16 that is formed from the metallic paste serves as a conductive back surface field and a backside electrical contact of a solar cell.

Figure 3:
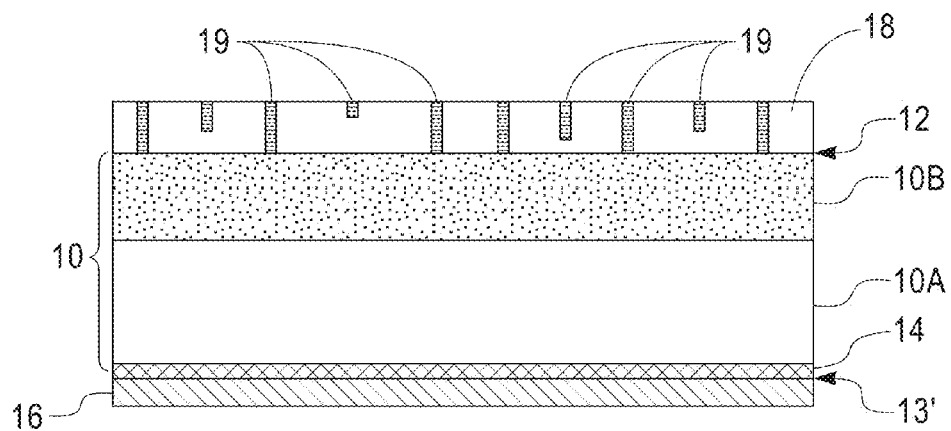
FIG. 3 is a pictorial representation (through a cross sectional view) illustrating the structure of FIG. 2 after forming an antireflective coating (ARC) on a front side surface of the semiconductor substrate.

Referring now to FIG. 3, there is illustrated the structure shown in FIG. 2 after forming an antireflective coating (ARC) 18 on the front side surface 12 of the semiconductor substrate 10. During the formation of the ARC, pin holes 19 are introduced into the ARC 18. The width, length, and shape of each pin hole 19 that forms may vary depending upon the type of ARC material employed as well as the underlying quality of the front side surface 12 of the semiconductor substrate 10. The quantity (i.e., number) of pin holes 19 that is formed also varies depending upon the type of ARC material employed as well as the underlying quality of the front side surface 12 of the semiconductor substrate 10.

The ARC 18 that can be employed includes any conventional ARC material that can reduce reflection from the surface of semiconductor substrate 10. In one embodiment, the ARC 18 that can be employed may be an inorganic ARC such as, for example, silicon oxynitride, silicon nitride, silicon carbide, silicon oxynitride, SiCOH, siloxanes, silanes, carbosilanes, oxycarbosilanes, silsesquioxanes, titanium oxide, and magnesium fluoride. In another embodiment of the invention, the ARC 18 that can be employed is an organic ARC such as, for example, organic homopolymers or copolymers of polyesters, polyimides, polyacrylates, polymethacrylates, and polysufones. In one preferred embodiment, the ARC 18 is comprised of silicon nitride.

The ARC 18 can be formed utilizing techniques well known to those skilled in the art. For example, an ARC composition can be applied to the front side surface 12 of the semiconductor substrate 10 utilizing a conventional deposition process including, for example, spin-on coating, dip coating, evaporation, chemical solution deposition, chemical vapor deposition (CVD), and plasma enhanced chemical vapor deposition (PECVD).

In some embodiments, the as-deposited ARC composition may be subjected to a post deposition treatment to improve the properties of the entire layer or the surface of the ARC 18. This post deposition treatment can be selected from heat treatment, irradiation of electromagnetic wave (such as ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

It is observed that while the present disclosure describes and illustrates the processing of the back side surface 13 prior to forming the ARC 18 on the front side surface 12, the order of these two steps can be reversed such the ARC 18 is formed on the front side surface 12 of the semiconductor substrate 10 prior to processing the back side surface 13 of the semiconductor substrate 10.

Figure 4:
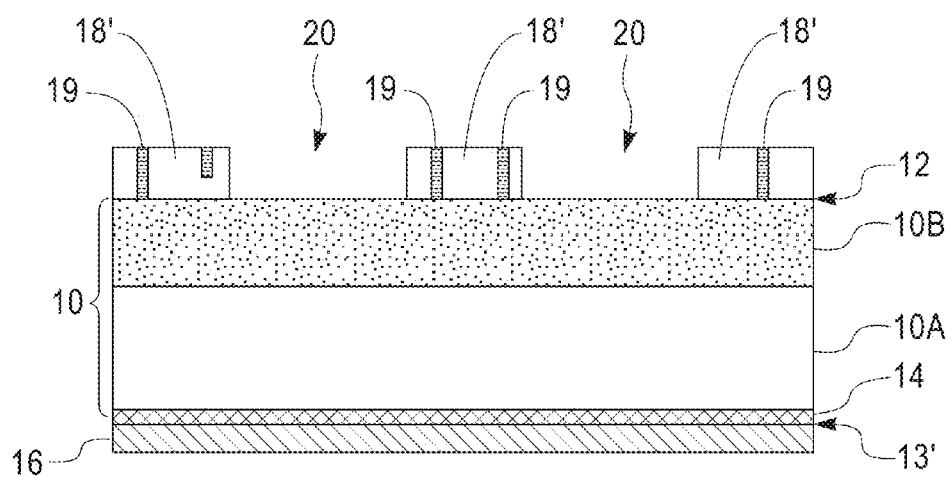
FIG. 4 is a pictorial representation (through a cross sectional view) illustrating the structure of FIG. 3 after patterning the ARC to open a grid pattern down to a portion of the front side surface of the semiconductor substrate.

Referring now to FIG. 4, there is illustrated the structure of FIG. 3 after patterning the ARC 18 to open a grid pattern within the ARC 18 down to a portion of the front side surface 12 of the semiconductor substrate 10. In FIG. 4, the patterned ARC is labeled as 18' and the grid pattern is labeled as 20. As illustrated in the drawings, some of the pin holes 19 remain in the patterned ARC 18', while other pin holes are removed during the patterning process.

The ARC 18 can be patterned utilizing lithography and etching. The lithographic process can include, for example, applying an optional adhesion promoter layer (not shown), such as hexamethyldisilazane (HMDS) to the surface of as-deposited ARC 18, applying a photoresist (not shown) to an upper surface of the as-deposited ARC 18 or the adhesion promoter layer, if present, exposing the photoresist to a desired pattern of radiation and developing the exposed photoresist utilizing a conventional resist developer. A patterned photoresist is thus provided. In another embodiment, the patterning can be achieved using ink jet printing techniques. The pattern in the photoresist or ink jet mask is transferred to the as-deposited ARC 18 utilizing an etching process such as, for example, dry etching or chemical wet etching. In one embodiment, the wet etch of silicon nitride utilizes a strong HF solution having a concentration between 5% to 50%. In another embodiment, the front side ARC patterning can use laser ablation without a lithographic process.

Figure 5:
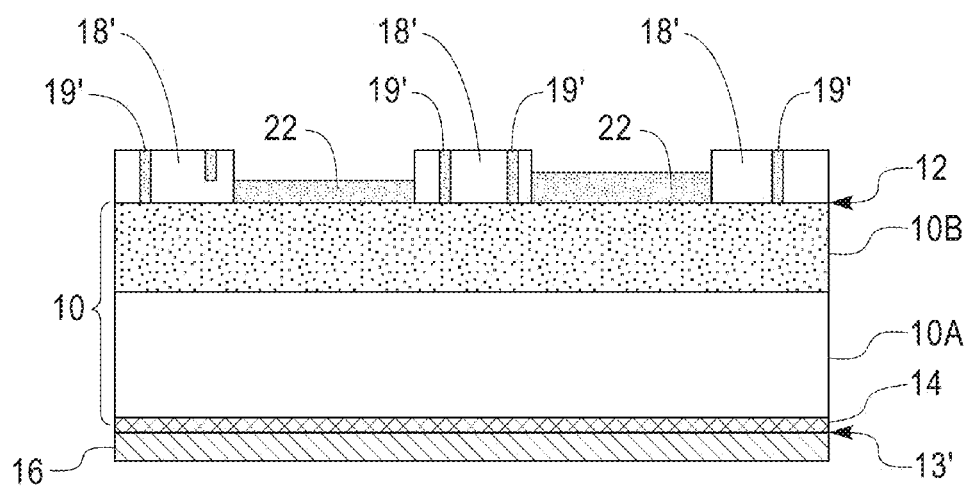
FIG. 5 is a pictorial representation (through a cross sectional view) illustrating the structure of FIG. 4 after forming a front side surface metallic film within the grid pattern.

Referring now to FIG. 5, there is illustrated the structure of FIG. 4 after forming a front side surface metallic film 22 within the grid pattern 20. The front side surface metallic film 22 is formed by electrodeposition typically, in the presence of light. It is noted that during the electrodeposition process used in forming the front side surface metallic film 22, the pin holes 19 are also filled with a same metallic material as used in forming the front side surface metallic film 22. In FIG. 5, reference numeral 19' denotes the metallic filled pin holes 19' that are present within the patterned ARC 18'.

The front side surface metallic film 22 and the correspondingly metallic filled pin holes 19' that are formed by electrodeposition may comprise any metal or metal alloy. In one embodiment, the front side surface metallic film 22 and the correspondingly metallic filled pin holes 19' that are formed by electrodeposition are comprised of Ni, Co, Cu, Zn, Pt, Ag, Pd, Sn, Fe, In or alloys thereof. In another embodiment, the front side surface metallic film 22 and the correspondingly metallic filled pin holes 19' that are formed by electrodeposition are comprised of Ni, Co, Cu, Zn, Pt, Fe or alloys thereof. In a further embodiment, the front side surface metallic film 22 and the correspondingly metallic filled pin holes 19' that are formed by electrodeposition are comprised of Ni or a Ni alloy.

The electrodeposition method used in forming the front side surface metallic film 22 and the correspondingly metallic filled pin holes 19' may include materials, apparatuses and conditions (i.e., temperatures, and waveforms) used in electroplating the back side surface metallic film 16. As such, the above description including, for example, materials, apparatuses and conditions, regarding the electrodeposition of the back side surface metallic film 16 can be used in electrodepositing the front side surface metallic film 22 and the correspondingly metallic filled pin holes 19. Applicants thus incorporate the above description regarding the electrodeposition of the back side surface metallic film 16 herein by reference and indicate that the same can be used to form the front side surface metallic film 22 within grid patterns 20 as well as the correspondingly metallic filled pin holes 19'. The front side surface metallic film 22 and the correspondingly metallic filled pin holes 19' may comprise the same or different metal or metal alloy as the back side surface metallic film 16.

The thickness of the metallic film that is electrodeposited may vary depending on the type of metal being electrodeposition, the type of electroplating bath employed as well as the duration of the electrodeposition process itself. Typically, the front side surface metallic film 22 that is formed from the electrodeposition described in this disclosure is from 50 Å to 50000 Å, with a thickness from 5000 Å to 50000 Å being more typical. Moreover, the electrodeposition method that includes current waveforms from low to high provides complete coverage of the electrodeposited front side surface metallic film 22 on the exposed surface of the semiconductor substrate 10. By "complete coverage", it is meant that the front side surface metallic film 22 is continuously present within the grid pattern 20 such that one edge of the front side surface metallic film 22 is in contact with an edge of one patterned ARC and another edge of the front side surface metallic film 22 is in contact with an edge of a neighboring patterned ARC.

In some embodiments, light illumination can be used to increase metal nucleation and growth during the electrodeposition of the front side surface metallic film 22. In particular, light illumination can be used in embodiments to generate free electrons that can be used during the electrodeposition process. When light illumination is employed during the electrodeposition process, any conventional light source can be used. The intensity of the light employed may vary and is typically greater than 5000 Lux, with an intensity of light from 10000 Lux to 50000 Lux being more typical.

In one embodiment (not shown) the metallic filled pin holes 19' can be partially filled after the electrodeposition process. In another embodiment (as illustrated in FIG. 5), the metallic filled pin holes 19' can be completely filled after the electrodeposition process. In a further embodiment (also not shown), some of the electrodeposited material forms on the upper surface of the patterned ARC 18'.

At this point of the present disclosure the quantity (i.e., number) of metallic filled pin holes 19' (and hence the number of pin holes 19) can be determined. In one embodiment, the quantity/density of the metallic filled pin holes 19' is performed visually. In another embodiment, the quantity/density of the metallic filled pin holes 19' is determined optically. In another embodiment, the quantity/density of the metallic filled pin holes 19' is determined by SEM. In yet another embodiment, both visual and optional means can be employed to determine the quantity of metallic pin holes 19, within the patterned ARC 18'. The quantity of metallic filled pin holes 19' (and hence the number of pin holes 19 in the patterned ARC 18') can be computed by hand or utilizing a computer program that is capable of doing the same.

If the number of metallic filled pin holes 19' is determined to be too high for a given ARC, the surface of the semiconductor substrate used in forming the next solar cell or batch of solar cells can be subjected to a different cleaning process. After using the different cleaning process, a patterned ARC can be formed on a front side surface of another semiconductor substrate and thereafter a metallic grid can be formed on the exposed surface of the front side surface of the semiconductor substrate has described above. Pin holes present in the patterned ARC can be determined as described above and if the number of metallic filled pin holes is determined to be satisfactory for a given ARC the process has been optimized. If not the above is repeated until a satisfactory number of metallic filled pin holes is determined.

The acceptable range of pin hole density will be up to each solar cell manufacturer's definition. As a general rule, a density of pin holes higher than 1000 $mm^{-2}$ indicates severe residue problem on the silicon surface before nitride deposition, while a density of pin holes less than 50 $mm^{-2}$ gives acceptable negligible impact on solar cell performance.

Figure 6:
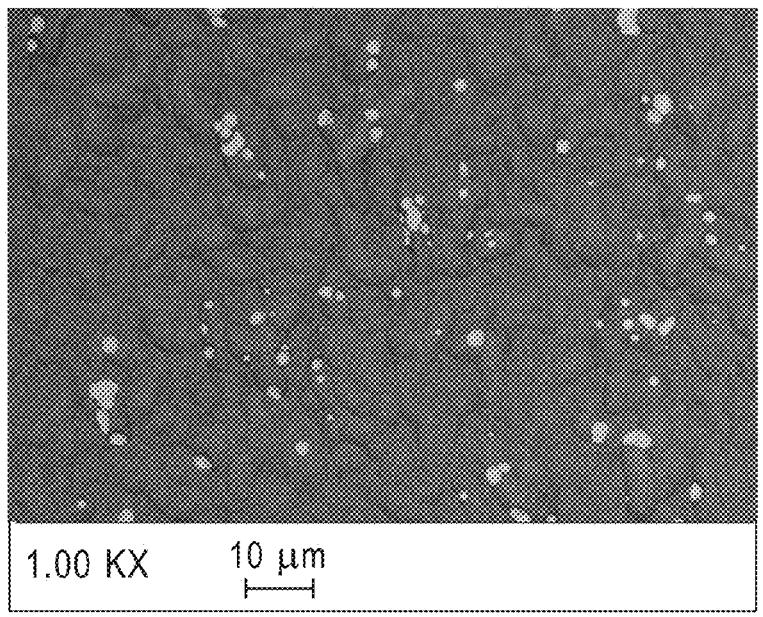
FIG. 6 is a SEM of a portion of a patterned ARC that is located on a front side surface of a semiconductor substrate that includes metallic filled pin holes therein.
Figure 7:
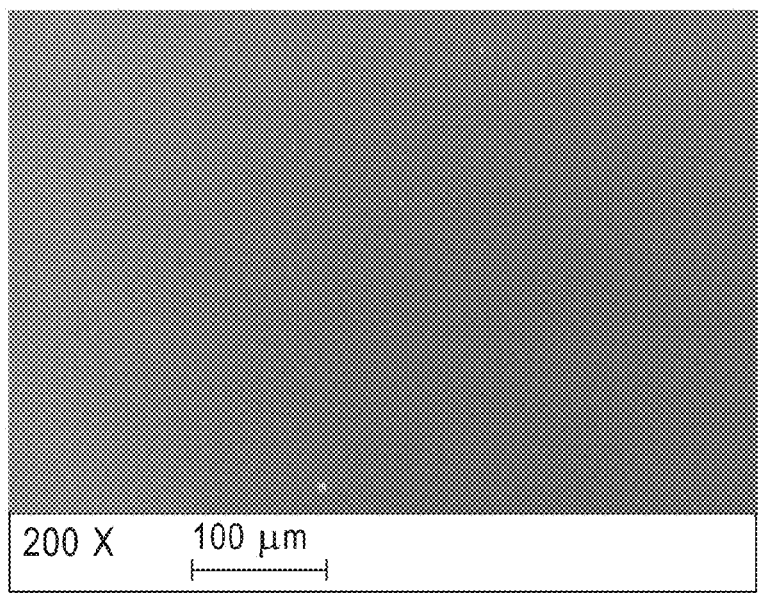
FIG. 7 is a SEM of a portion of a patterned ARC that is located on a front side surface of a semiconductor substrate that includes metallic filled pin holes therein.

Referring now to FIGS. 6 and 7 there are shown various SEMs of separate solar cells that have been processed in the manner described above. Each SEM shows a portion of a patterned ARC that is located on a front side surface of a semiconductor substrate that includes metallic filled pin holes therein. The solar cell in these two SEMs have been processed identically except for the cleaning process that was used to clean the front side surface of the semiconductor substrate. As can be observed, the SEM shown in FIG. 6 has a much higher density of metallic filled pin holes than the SEM shown in FIG. 7. The processes of FIG. 6 is not acceptable, while the processes used in FIG. 7 is a significant improvement over FIG. 6, and is generally acceptable.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method to determine the cleanness of a semiconductor substrate and the quantity/density of pin holes within an antireflective coating of a solar cell structure, said method comprising:

providing a semiconductor substrate including a p-type semiconductor portion and an overlying n-type semiconductor portion, wherein an exposed surface of the p-type semiconductor portion defines a back side surface of the semiconductor substrate and wherein an exposed surface of the n-type semiconductor portion defines a front side surface;

forming a patterned antireflective coating including a grid pattern therein on the front side surface of the semiconductor substrate, wherein said patterned antireflective coating includes pin holes therein;

forming a front side surface metallic film within the grid pattern by electrodeposition, wherein during said electrodeposition the pin holes in the patterned antireflective coating are filled with a metallic material; and determining a quantity/density of the metallic filled pin holes in the patterned antireflective coating.

2. The method of claim 1 wherein said back side surface is processed prior to forming said patterned antireflective coating.

3. The method of claim 2 further comprising forming at least a back side metallic film on said back side surface.

4. The method of claim 3 wherein said forming the at least back side metallic film includes screen printing.

5. The method of claim 3 wherein said forming the at least back side metallic film includes electrodeposition.

6. The method of claim 5 wherein said electrodeposition of the back side metallic film includes first forming a P++ back side surface field layer at the backside surface of the semiconductor substrate.

7. The method of claim 6 wherein said forming the P++ back side surface field layer includes electroplating a p-type dopant layer on the back side surface of the semiconductor substrate and annealing.

8. The method of claim 1 wherein said back side surface is processed after forming said patterned antireflective coating.

9. The method of claim 8 further comprising forming at least a back side metallic film on said back side surface.

10. The method of claim 9 wherein said forming the at least back side metallic film includes screen printing.

11. The method of claim 8 wherein said forming the at least back side metallic film includes electrodeposition.

12. The method of claim 11 wherein said electrodeposition of the back side metallic film includes first forming a P++ back side surface field layer at the backside surface of the semiconductor substrate.

13. The method of claim 12 wherein said forming the P++ back side surface field layer includes electroplating a p-type dopant layer on the back side surface of the semiconductor substrate and annealing.

14. The method of claim 1 further comprising cleaning the front side surface of the semiconductor substrate prior to forming the patterned antireflective coating.

15. The method of claim 1 wherein said forming the front side surface metallic film within the grid pattern includes a metal or metal alloy including at least one of Ni, Co, Cu, Al, Ag, Au, Zn, Pt and Fe, and electroplating said metal or metal alloy from an electroplating bath.

16. The method of claim 15 wherein said electroplating is performed in the presence of light illumination.

17. The method of claim 15 wherein said electroplating is performed utilizing a current waveform comprising a low current density from 5 mAmps/cm$^2$ to 40 mAmps/cm$^2$ performed for a first period of time, followed by a high current density of greater than 40 mAmps/cm$^2$ for a second period of time.

18. The method of claim 1 wherein said determining the quantity of the metallic filled pin holes in the patterned antireflective coating includes visual, optical, SEM, or a combination thereof.

19. A method to determine the cleanness of a semiconductor substrate and the quantity/density of pin holes within an antireflective coating of a solar cell structure, said method comprising:
providing a semiconductor substrate including a p-type semiconductor portion and an overlying n-type semiconductor portion, wherein an exposed surface of the p-type semiconductor portion defines a back side surface of the semiconductor substrate and wherein an exposed surface of the n-type semiconductor portion defines a front side surface;
roughening the front side surface of the semiconductor substrate;
processing the back side surface of the semiconductor substrate to include at least a back side surface metallic film;
cleaning the front side surface of the semiconductor substrate to eliminate native oxide formation;
forming a patterned antireflective coating including a grid pattern therein on the cleaned front side surface of the semiconductor substrate, wherein said patterned antireflective coating includes pin holes therein;
forming a front side surface metallic film within the grid pattern by electrodeposition, wherein during said electrodeposition the pin holes in the patterned antireflective coating are filled with a metallic material; and
determining a quantity/density of the metallic filled pin holes in the patterned antireflective coating.

20. A method to determine the cleanness of a semiconductor substrate and the quantity/density of pin holes within an antireflective coating of a solar cell structure, said method comprising:
providing a semiconductor substrate including a p-type semiconductor portion and an overlying n-type semiconductor portion, wherein an exposed surface of the p-type semiconductor portion defines a back side surface of the semiconductor substrate and wherein an exposed surface of the n-type semiconductor portion defines a front side surface;
roughening the front side surface of the semiconductor substrate;
forming a patterned antireflective coating including a grid pattern therein on the cleaned front side surface of the semiconductor substrate, wherein said patterned antireflective coating includes pin holes therein;
processing the back side surface of the semiconductor substrate to include at least a back side surface metallic film;
forming a front side surface metallic film within the grid pattern by electrodeposition, wherein during said electrodeposition the pin holes in the patterned antireflective coating are filled with a metallic material; and
determining a quantity/density of the metallic filled pin holes in the patterned antireflective coating.

* * * * *